United States Patent
Zhang et al.

(10) Patent No.: US 11,942,324 B2
(45) Date of Patent: Mar. 26, 2024

(54) METHOD FOR BEOL METAL TO DIELECTRIC ADHESION

(71) Applicant: Applied Materials, Inc., Santa Clara, CA (US)

(72) Inventors: Qintao Zhang, Mt Kisco, NY (US); Jun-Feng Lu, Shanghai (CN); Ting Cai, Shanghai (CN); Ma Ning, Shanghai (CN); Weiye He, Shanghai (CN); Jian Kang, Shanghai (CN)

(73) Assignee: Applied Materials, Inc., Santa Clara, CA (US)

( * ) Notice: Subject to any disclaimer, the term of this patent is extended or adjusted under 35 U.S.C. 154(b) by 504 days.

(21) Appl. No.: 17/266,415

(22) PCT Filed: Jun. 10, 2020

(86) PCT No.: PCT/CN2020/095443
§ 371 (c)(1),
(2) Date: Feb. 5, 2021

(87) PCT Pub. No.: WO2021/248378
PCT Pub. Date: Dec. 16, 2021

(65) Prior Publication Data
US 2022/0189774 A1   Jun. 16, 2022

(51) Int. Cl.
*H01L 21/265* (2006.01)
*H01L 21/3065* (2006.01)
(Continued)

(52) U.S. Cl.
CPC .... *H01L 21/26513* (2013.01); *H01L 21/3065* (2013.01); *H01L 21/3212* (2013.01); *H01L 21/76859* (2013.01); *H01L 21/76877* (2013.01)

(58) Field of Classification Search
CPC ............... H01L 21/76877; H01L 21/76859
See application file for complete search history.

(56) References Cited

U.S. PATENT DOCUMENTS 6,429,105 B1 * 8/2002 Kunikiyo .......... H01L 21/76801
                                                          438/723
6,756,303 B1 * 6/2004 Erb ................... H01L 21/76843
                                                          438/653
(Continued)

FOREIGN PATENT DOCUMENTS

| | | |
|---|---|---|
| CN | 103681466 A | 3/2014 |
| CN | 110911343 A | 3/2020 |
| EP | 0178803 A2 | 4/1986 |

OTHER PUBLICATIONS

W Peng, et al., "Elimination of Tungsten-Voids in Middle-Of-Line Contacts for Advanced Planar CMOS and FINFET Technology," 2016 27th Annual SEMI Advanced Semiconductor Manufacturing Conference (ASMC), 4 pages.
(Continued)

*Primary Examiner* — Walter H Swanson
*Assistant Examiner* — Jacob T Nelson
(74) *Attorney, Agent, or Firm* — KDW Firm PLLC

(57) ABSTRACT

A method of promoting adhesion between a dielectric layer of a semiconductor device and a metal fill deposited within a trench in the dielectric layer, including performing an ion implantation process wherein an ion beam formed of an ionized dopant species is directed into the trench at an acute angle relative to a top surface of the dielectric layer to form an implantation layer in a sidewall of the trench, and depositing a metal fill in the trench atop an underlying bottom metal layer, wherein the metal fill adheres to the sidewall.

18 Claims, 4 Drawing Sheets

(51) Int. Cl.
    *H01L 21/321*     (2006.01)
    *H01L 21/768*     (2006.01)

(56) References Cited

U.S. PATENT DOCUMENTS

| | | | |
|---|---|---|---|
| 10,468,269 B2 * | 11/2019 | Yang | H01L 21/76825 |
| 2007/0145598 A1 * | 6/2007 | Kang | H01L 21/76825 |
| | | | 257/E23.145 |
| 2017/0077830 A1 * | 3/2017 | Fujii | H01L 29/66212 |
| 2020/0135767 A1 | 4/2020 | Ge et al. | |

OTHER PUBLICATIONS

International Search Report and Written Opinion dated Mar. 8, 2021, for the International Patent Application No. PCT/CN2020/095443, filed on Jun. 10, 2020, 9 pages.

* cited by examiner

METHOD FOR BEOL METAL TO DIELECTRIC ADHESION

CROSS-REFERENCE TO RELATED APPLICATION

This is a national stage application filed under 35 U.S.C. § 371 of pending international application Patent Application No. PCT/CN2020/095443, filed Jun. 10, 2020, the entirety of which is incorporated by reference herein.

FIELD OF THE DISCLOSURE

Embodiments of the present disclosure relate to semiconductor device fabrication techniques and, more particularly, to a technique for promoting metal to dielectric adhesion during the back-end-of-line portion of semiconductor device fabrication.

BACKGROUND OF THE DISCLOSURE

During the fabrication of semiconductor devices (e.g., integrated circuits), so-called "back-end-of-line" processes are performed wherein various metal interconnect layers, wires, vias, etc. are formed in a semiconductor wafer and/or in dielectric layers disposed thereon. For example, a trench contact may be formed in a dielectric layer formed of $SiO_2$ to provide an electrical connection to an underlying metallic layer ("bottom metal layer"). This may involve forming a trench in the dielectric layer to expose the metallic layer, filling the trench with tungsten or another suitable metal fill, and performing a chemical metal planarization (CMP) process to remove excess tungsten and planarize the top of the filled trench.

The above-described process is associated with certain challenges and shortcomings. For example, tungsten does not adhere to $SiO_2$ (i.e., the material of the dielectric layer). Thus, when tungsten is deposited within the trench in the dielectric layer, gaps or cavities may form in the tungsten at the interface of the two materials at the sidewall of the trench. Subsequently, when the CMP process is performed, oxidizing chemicals used in the CMP process may seep into the gaps and cavities along the sidewall of the trench and may oxidize the tungsten within the trench as well as the underlying metallic layer. This may diminish the conductivity of the tungsten and/or the metallic layer and may thus be detrimental to the performance of the semiconductor device as a whole.

With respect to these and other considerations, the present improvements may be useful.

SUMMARY

This summary is provided to introduce a selection of concepts in a simplified form further described below in the detailed description. This summary is not intended to identify key features or essential features of the claimed subject matter, nor is the summary intended as an aid in determining the scope of the claimed subject matter.

A method of promoting adhesion between a dielectric layer of a semiconductor device and a metal fill deposited within a trench in the dielectric layer in accordance with the present disclosure may include performing an ion implantation process wherein an ion beam formed of an ionized dopant species is directed into the trench at an acute angle relative to a top surface of the dielectric layer to form an implantation layer in a sidewall of the trench, and depositing a metal fill in the trench atop an underlying bottom metal layer, wherein the metal fill adheres to the sidewall.

A method of forming a contact trench in a dielectric layer of a semiconductor device layer in accordance with the present disclosure may include disposing a photoresist layer on the dielectric layer, performing a photolithography process including forming an aperture in the photoresist layer and directing an ion beam formed of reactive plasma ions into the aperture to form a trench in the dielectric layer, performing an ion implantation process wherein an ion beam formed of an ionized dopant species is directed into the trench at an acute angle relative to a top surface of the dielectric layer to form an implantation layer in a sidewall of the trench, depositing a metal fill in the trench atop an underlying bottom metal layer, wherein the metal fill adheres to the sidewall.

Another method of forming a contact trench in a dielectric layer of a semiconductor device layer in accordance with the present disclosure may include disposing a photoresist layer on the dielectric layer, performing a photolithography process including forming an aperture in the photoresist layer and directing an ion beam formed of reactive plasma ions into the aperture to form a trench in the dielectric layer, performing an ion implantation process wherein an ion beam formed of ionized silicon is directed into the trench at an acute angle relative to a top surface of the dielectric layer to form an implantation layer in a sidewall of the trench, wherein the ion implantation process is performed at a temperature between 150 degrees Celsius and 500 degrees Celsius, etching the implantation layer back to a depth where a concentration of silicon is higher than in other portions of the implantation layer, depositing tungsten in the trench atop an underlying bottom metal layer, wherein the tungsten adheres to the sidewall, and performing a chemical metal planarization process to remove excess tungsten overflowing from a top of the trench.

BRIEF DESCRIPTION OF THE DRAWINGS

By way of example, various embodiments of the disclosed techniques will now be described with reference to the accompanying drawings, wherein.

DETAILED DESCRIPTION

Figure 1A:
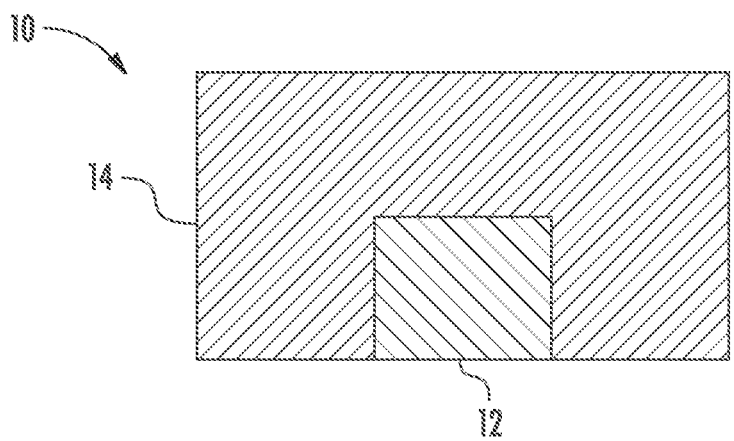
FIGS. 1A-1J are a series of cross-sectional views illustrating a method for promoting metal to dielectric adhesion during the formation of a contact trench in a semiconductor device in accordance with an exemplary embodiment of the present disclosure.

The present embodiments will now be described more fully hereinafter with reference to the accompanying drawings, wherein some exemplary embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

The present disclosure is directed to a novel technique for forming a contact trench in a dielectric layer of a semiconductor device, and in particular a novel technique for forming such a contact trench in a manner facilitating adhesion between metal (e.g., tungsten) fill deposited within the trench and the material of the surrounding dielectric layer (e.g., $SiO_2$) during a back-end-of-line (BEOL) portion of a semiconductor device fabrication process. The technique of the present disclosure will be described with reference to a series of schematic, cross-sectional views shown in FIGS. 1A-1J illustrating various, exemplary processes performed as part of the disclosed technique.

Referring to FIG. 1A, a portion of a generic semiconductor device 10 is illustrated and may include a bottom metal layer 12 covered by a dielectric layer 14. The term "semiconductor device" is used generically herein and may refer to any type of semiconductor device structure having the aforementioned layers and being amenable to partial fabrication using the processes disclosed herein. Exemplary semiconductor devices include, and are not limited to, op-amps, resistors, capacitors, diodes, transistors, etc. Thus, the portion of a generic semiconductor device 10 is illustrated generically in the figures with various components being omitted. Those of ordinary skill in the art will understand the generic semiconductor device 10 may include numerous additional elements, layers, and/or structures depending on the particular type of semiconductor device being implemented. Those of ordinary skill in the art will further appreciate the techniques and processes of the present disclosure may also be implemented in the fabrication of various other electronic components requiring the formation of contact trenches wherein adhesion between a metal and a dielectric layer is desirable.

In a non-limiting, exemplary embodiment of the present disclosure, the bottom metal layer 12 may be formed of cobalt. The present disclosure is not limited in this regard, and in various alternative embodiments the bottom metal layer 12 may be formed of various other electrically conductive materials, including, and not limited to, copper, gold, silver, etc. In a non-limiting, exemplary embodiment of the present disclosure, the dielectric layer 14 may be formed of $SiO_2$. The present disclosure is not limited in this regard, and in various alternative embodiments the dielectric layer 14 may be formed of various other dielectric materials, including, and not limited to, carbon doped $SiO_2$ (SiOC), SiOF, SiOCH, etc.

Figure 1B:
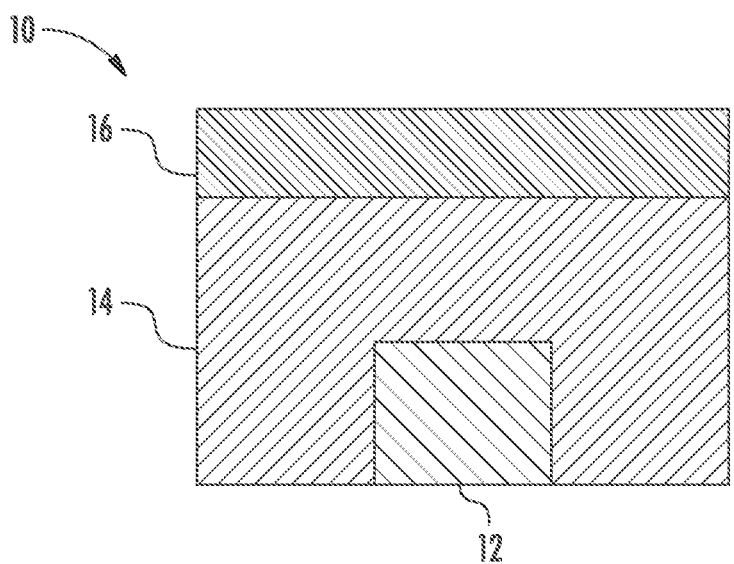
Figure 1C:
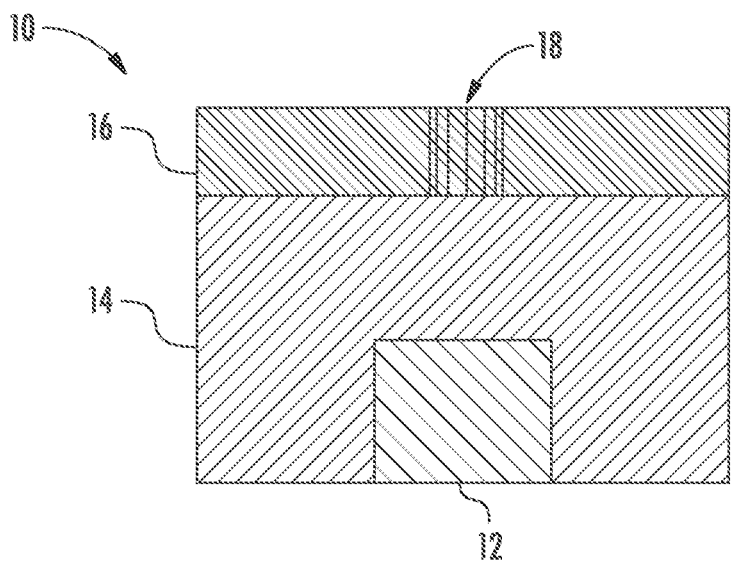
Figure 1D:
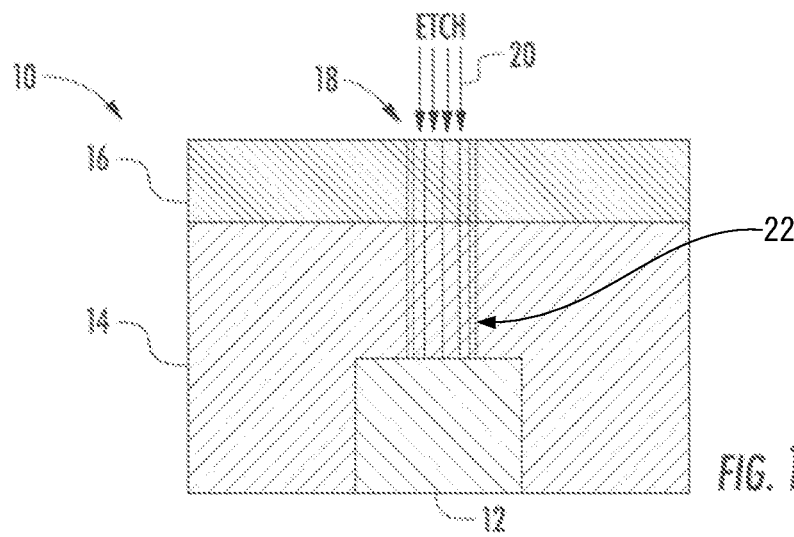

Referring to FIG. 1B, a photoresist layer 16 may be disposed on top of the dielectric layer 14. The photoresist layer 16 may be formed of any light-sensitive organic material suitable for photolithography processes as will be familiar to those of ordinary skill in the art. Referring to FIG. 1C, a conventional photolithography process may be performed, wherein the photoresist layer 16 may be masked, exposed to a radiation source, and developed to form a slot or aperture 18 (hereinafter "the aperture 18") in the photoresist layer 16. The aperture 18 may be located directly above the bottom metal layer 12. Referring to FIG. 1D, the photolithography process may further include an ion etching process (e.g., a reactive-ion etching process), wherein an ion beam 20 formed of reactive plasma ions may be directed into the aperture 18 at an angle perpendicular to the top surface of the photoresist layer 16. The ion beam 20 may etch the dielectric layer 14, thus forming a trench 22 extending entirely through the dielectric layer 14 and exposing a top surface of the underlying bottom metal layer 12. The photolithography process may further include removal (e.g., etching or dissolving) of the photoresist layer 16 to minimize angle requirements during implantation of the sidewall of the trench 22 as further described below.

Figure 1E:
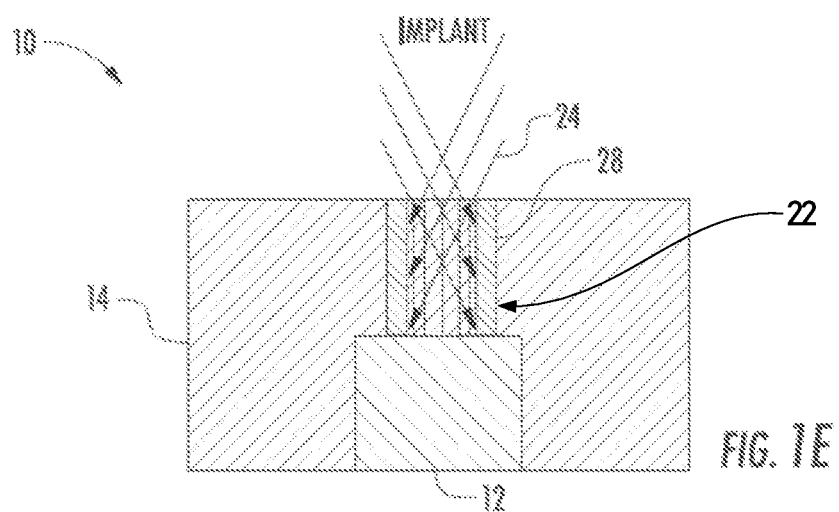
Figure 1F:
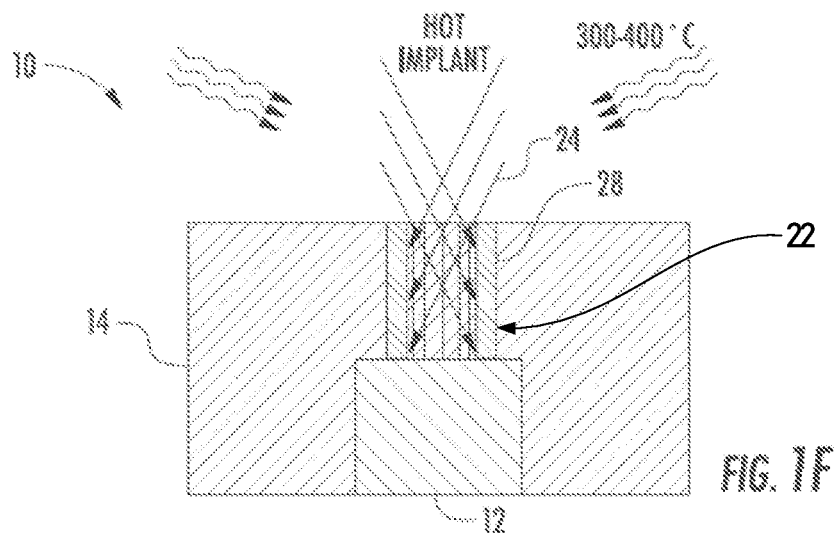
Figure 1G:
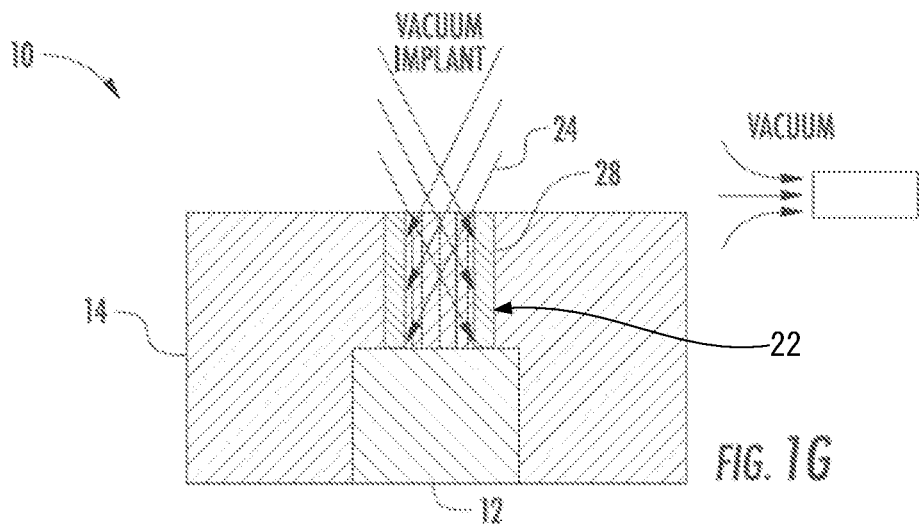
Figure 1H:
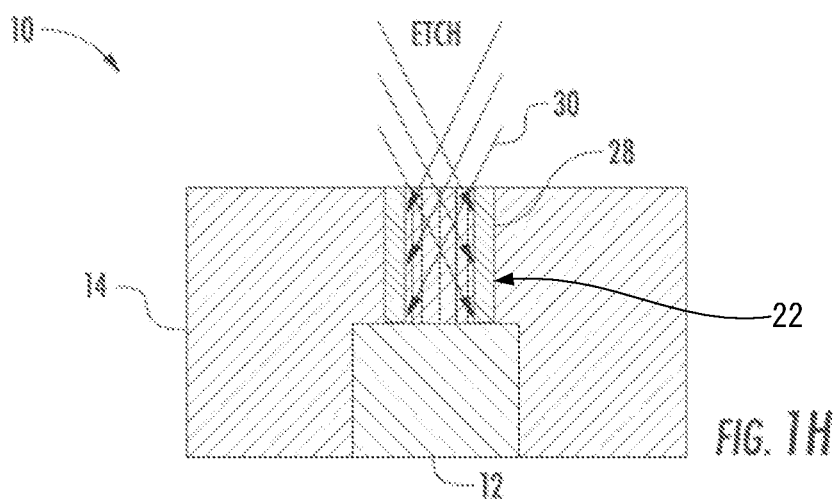

Referring to FIG. 1E, an ion implantation process may be performed, wherein an ion beam 24 formed of an ionized dopant species may be directed into the trench 22 at acute angles relative to the top surface of the dielectric layer 14, thus forming an implantation layer 28 in the sidewall. The dopant species transmitted in the ion beam 24 may be Si, selected to make the sidewall of the trench 22 receptive to adhesion with a metal fill deposited in the trench 22 as further described below. Particularly, since certain metals, such as tungsten, adhere well to Si, implanting the sidewall of the trench 22 with Si may facilitate adhesion between the sidewall and a tungsten fill deposited within the trench 22 during a BEOL portion of semiconductor device fabrication. In various alternative embodiments, the dopant species may be germanium, carbon, etc. The present disclosure is not limited in this regard.

Implanting the sidewall of the trench 22 with a dose of Si within a particular dosage range at room temperature may facilitate effective adhesion of tungsten to the sidewall, while dosages outside of the range may result in poor adhesion and/or damage to the sidewall. For example, an implant dose at or below $5e16$ ions/cm$^2$ at room temperature has been shown to result in insufficient Si deposition to provide good tungsten adhesion, while an implant dose at or above $2e17$ ions/cm$^2$ at room temperature has been shown to result in damage to the sidewall and thus poor tungsten adhesion. An implant dose of $1e17$ ions/cm$^2$ at room temperature has been shown to result in good Si deposition and to thus facilitate good adhesion of tungsten to the sidewall. Performing implantation at elevated temperatures (so called "hot implant" or "thermion implant") has been shown to broaden the range of effective implant dosages for facilitating the adhesion of tungsten to the sidewall of the trench 22. For example, with reference to FIG. 1F, performing implantation at temperatures in a range of 150 degrees Celsius to 500 degrees Celsius with an implant dose of $1e16$ ions/cm$^2$ has been shown to result in good Si deposition and to thus facilitate good adhesion of tungsten to the sidewall. Performing implantation in a vacuum environment has also been shown to broaden the range of effective implant dosages for facilitating the adhesion of tungsten to the sidewall of the trench 22. For example, with reference to FIG. 1G, performing implantation at room temperature with an implant dose of $1e16$ ions/cm$^2$ while maintaining a vacuum (or near vacuum) environment has been shown to result in good Si deposition and to thus facilitate good adhesion of tungsten to the sidewall.

As will be recognized by those of ordinary skill in the art, the implantation layer 28 may have an "implantation profile," wherein a concentration of implanted Si may vary with the depth of the implantation layer 28 (as measured from the sidewall). Thus, referring to FIG. 1H, an ion etching process (e.g., a reactive ion etching process) may be performed, wherein an ion beam 30 formed of reactive plasma ions may be directed into the trench 22 at acute angles relative to the top surface of the dielectric layer 14. The ion beam 30 may etch the implantation layer 28 back to a depth where the concentration of Si is highest (or relatively higher than in other portions of the implantation layer 28). In various embodiments, a "wet etch" process may be employed, wherein etching will automatically stop at an Si rich portion of the implantation layer 28. The present disclosure is not limited in this regard. Thus, the exposed surface of the etched sidewall may be rich in Si and thus primed for adhesion with tungsten (or other suitable metal fill).

Figure 1I:
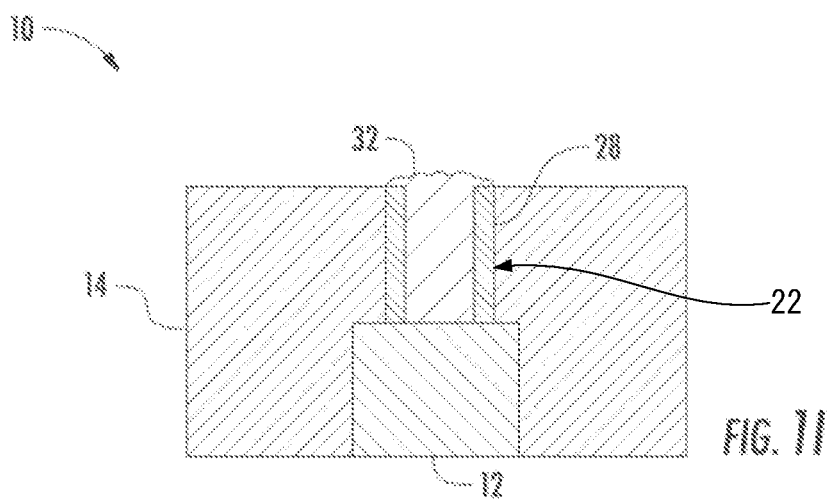

Referring to FIG. 1I, a metal fill 32 formed of tungsten or another suitable metal may be deposited within the trench 22 atop the bottom metal layer 12. Deposition may be achieved by physical vapor deposition, chemical vapor deposition, atomic layer deposition, etc. The present disclosure is not limited in this regard. The trench 22 may be filled until the metal fill 32 overflows from the top of the trench 22 to ensure complete and total filling of the trench 22. Since tungsten is able to adhere to the Si-rich sidewall of the trench 22, the formation of gaps or cavities at the juncture of the metal fill 32 and the sidewall may be mitigated or entirely prevented.

Figure 1J:
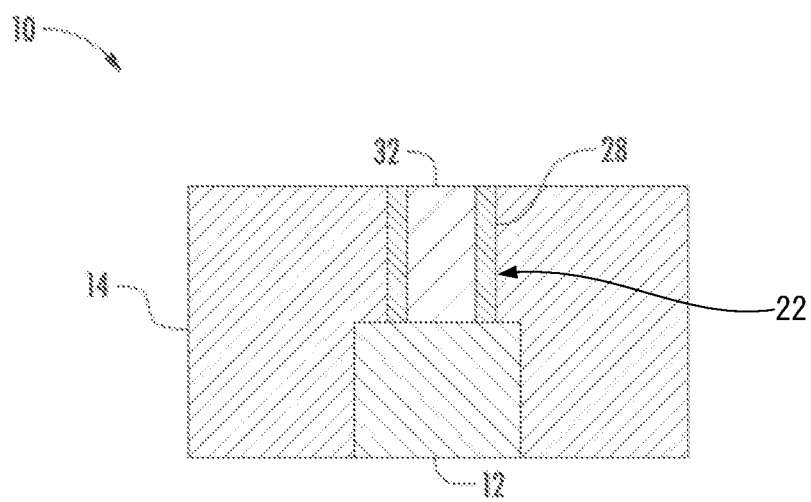

Referring to FIG. 1J, a chemical metal planarization (CMP) process may be performed to remove the excess metal fill 32 overflowing from the trench 22, thus making the top of the trench 22 coplanar with the adjacent top surface of the dielectric layer 14. Since there are no gaps or cavities at the juncture of the metal fill 32 and the sidewall, the oxidizing chemicals used to perform the CMP process are prevented from seeping into the trench 22 between the metal fill 32 and the sidewall. The metal fill 32 within the trench 22 and the bottom metal layer 12 are thus protected from the oxidizing chemicals, and the integrity and electrical conductivity of the metal fill 32 and the bottom metal layer 12 are thus preserved.

As will be appreciated by those of ordinary skill in the art, the above-described method for forming a contact trench in a dielectric layer of a semiconductor device provides distinct advantages relative to conventional methods for forming contact trenches. For example, the method of the present disclosure facilitates the formation of tungsten-filled contact trenches in a dielectric layer formed of $SiO_2$ with strong adhesion between the tungsten and the $SiO_2$, thus preventing or mitigating the formation of gaps and cavities at the interface of the two materials. As a further advantage, the absence of gaps and cavities between the tungsten and the surrounding $SiO_2$ prevents oxidizing chemicals from seeping therebetween during CMP processes, thus protecting the tungsten in the trench and an underlying bottom metal layer from being oxidized. The integrity and electrical conductivity of the tungsten fill material and the underlying bottom metal layer are thus preserved.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, while the present disclosure has been described herein in the context of a particular implementation in a particular environment for a particular purpose, those of ordinary skill in the art will recognize its usefulness is not limited thereto. Embodiments of the present disclosure may be beneficially implemented in any number of environments for any number of purposes. Accordingly, the claims set forth below shall be construed in view of the full breadth and spirit of the present disclosure as described herein.

The invention claimed is:

1. A method of promoting adhesion between a dielectric layer of a semiconductor device and a metal fill deposited within a trench in the dielectric layer, the method comprising:
    performing an ion implantation process wherein an ion beam formed of an ionized dopant species is directed into the trench at an acute angle relative to a top surface of the dielectric layer to form an implantation layer in a sidewall of the trench;
    etching the implantation layer back to a depth where a concentration of the implanted dopant species is higher than in other portions of the implantation layer; and
    depositing a metal fill in the trench atop an underlying bottom metal layer, wherein the metal fill adheres to the sidewall.

2. The method of claim 1, wherein the ion implantation process is performed at room temperature.

3. The method of claim 2, wherein the dopant species is silicon, and wherein an implant dose of the dopant species is in a range between 5e16 ions/$cm^2$ and 2e17 ions/$cm^2$.

4. The method of claim 1, where the ion implantation process is performed at a temperature between 150 degrees Celsius and 500 degrees Celsius.

5. The method of claim 4, wherein the dopant species is silicon, and wherein an implant dose of the dopant species is 1e16 ions/$cm^2$.

6. The method of claim 1, wherein the dopant species is selected from silicon, germanium, and carbon.

7. The method of claim 1, wherein the metal fill is formed of tungsten.

8. The method of claim 1, further comprising performing a chemical metal planarization process to remove excess metal fill overflowing from a top of the trench.

9. A method of forming a contact trench in a dielectric layer of a semiconductor device, the method comprising:
    disposing a photoresist layer on the dielectric layer;
    performing a photolithography process including forming an aperture in the photoresist layer and directing an ion beam formed of reactive plasma ions into the aperture to form a trench in the dielectric layer;
    performing an ion implantation process wherein an ion beam formed of an ionized dopant species is directed into the trench at an acute angle relative to a top surface of the dielectric layer to form an implantation layer in a sidewall of the trench;
    etching the implantation layer back to a depth where a concentration of the implanted dopant species is higher than in other portions of the implantation layer; and
    depositing a metal fill in the trench atop an underlying bottom metal layer, wherein the metal fill adheres to the sidewall.

10. The method of claim 9, further comprising removing the photoresist layer prior to performing the ion implantation process.

11. The method of claim 9, wherein the ion implantation process is performed at room temperature.

12. The method of claim 11, wherein the dopant species is silicon, and wherein an implant dose of the dopant species is in a range between 5e16 ions/$cm^2$ and 2e17 ions/$cm^2$.

13. The method of claim 9, where the ion implantation process is performed at a temperature between 150 degrees Celsius and 500 degrees Celsius.

14. The method of claim 13, wherein the dopant species is silicon, and wherein an implant dose of the dopant species is 1e16 ions/$cm^2$.

15. The method of claim 9, wherein the dopant species is selected from silicon, germanium, and carbon.

16. The method of claim 9, wherein the metal fill is formed of tungsten.

17. The method of claim 9, further comprising performing a chemical metal planarization process to remove excess metal fill overflowing from a top of the trench.

18. A method of forming a contact trench in a dielectric layer of a semiconductor device, the method comprising:
    disposing a photoresist layer on the dielectric layer;
    performing a photolithography process including forming an aperture in the photoresist layer and directing an ion beam formed of reactive plasma ions into the aperture to form a trench in the dielectric layer;

performing an ion implantation process wherein an ion beam formed of ionized silicon is directed into the trench at an acute angle relative to a top surface of the dielectric layer to form an implantation layer in a sidewall of the trench, wherein the ion implantation process is performed at a temperature between 150 degrees Celsius and 500 degrees Celsius;

etching the implantation layer back to a depth where a concentration of silicon is higher than in other portions of the implantation layer;

depositing tungsten in the trench atop an underlying bottom metal layer, wherein the tungsten adheres to the sidewall; and performing a chemical metal planarization process to remove excess tungsten overflowing from a top of the trench.

\* \* \* \* \*